(12) United States Patent
Zhang et al.

(10) Patent No.: US 12,317,464 B2
(45) Date of Patent: May 27, 2025

(54) PACKAGE BODY, PREPARATION METHOD THEREOF, TERMINAL, AND ELECTRONIC DEVICE

(71) Applicant: Honor Device Co., Ltd., Shenzhen (CN)

(72) Inventors: Le Zhang, Shenzhen (CN); Xueping Guo, Shenzhen (CN); Huijuan Wang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 177 days.

(21) Appl. No.: 18/041,762

(22) PCT Filed: Sep. 24, 2021

(86) PCT No.: PCT/CN2021/120376
§ 371 (c)(1),
(2) Date: Feb. 15, 2023

(87) PCT Pub. No.: WO2022/063239
PCT Pub. Date: Mar. 31, 2022

(65) Prior Publication Data
US 2023/0309281 A1    Sep. 28, 2023

(30) Foreign Application Priority Data

Sep. 25, 2020   (CN) .......................... 202011023979.6

(51) Int. Cl.
| | |
|---|---|
| *H05K 1/02* | (2006.01) |
| *H01L 21/56* | (2006.01) |
| *H01L 23/10* | (2006.01) |
| *H01L 23/29* | (2006.01) |
| *H01L 23/552* | (2006.01) |
| *H01L 23/60* | (2006.01) |

(Continued)

(52) U.S. Cl.
CPC .......... *H05K 9/0081* (2013.01); *H04M 1/026* (2013.01)

(58) Field of Classification Search
CPC ........ H05K 1/02; H05K 1/023; H05K 1/0216; H05K 1/0224; H05K 1/0237; H05K 1/114;
(Continued)

(56) References Cited

U.S. PATENT DOCUMENTS

| | | |
|---|---|---|
| 5,309,321 A | 5/1994 | Olla et al. |
| 9,508,656 B2 | 11/2016 | Chiu et al. |

(Continued)

FOREIGN PATENT DOCUMENTS

| | | |
|---|---|---|
| CN | 103369939 A | 10/2013 |
| CN | 104103631 A | 10/2014 |

(Continued)

*Primary Examiner* — Xiaoliang Chen
(74) *Attorney, Agent, or Firm* — Conley Rose, P.C.

(57) ABSTRACT

A package body includes: a substrate; a plurality of electronic components, arranged on the substrate; a package material layer, located on the substrate and packaging the plurality of electronic components; a low frequency shielding conductive structure, embedded in the package material layer, where the low frequency shielding conductive structure is located on a side of the package material layer away from the substrate and is spaced apart from the plurality of electronic components, the low frequency shielding conductive structure is provided with a plurality of through holes, an area of an opening of each of at least some of the through holes is less than 1 mm*1 mm, and a thickness of the low frequency shielding conductive structure is not less than 10 μm.

15 Claims, 9 Drawing Sheets

(51) Int. Cl.
*H01L 31/0216* (2014.01)
*H04M 1/02* (2006.01)
*H04M 1/26* (2006.01)
*H05K 9/00* (2006.01)

(58) Field of Classification Search
CPC ........ H05K 1/181; H05K 3/284; H05K 3/366; H05K 5/065; H05K 9/003; H05K 9/0024; H05K 9/0045; H05K 9/0081; H04M 1/026; H01L 21/56; H01L 21/565; H01L 21/4814; H01L 23/10; H01L 23/29; H01L 23/60; H01L 23/552; H01L 23/3121; H01L 23/3128; H01L 23/3135; H01L 23/3142; H01L 23/49827; H01L 24/49; H01L 24/97; H01L 25/0655; H01L 27/14603; H01L 27/14623; H01L 27/14636; H01L 27/14685; H01L 31/0216
USPC ........ 361/761, 699, 705, 766, 816; 257/700, 257/E21.002, E23.067; 381/174; 438/50
See application file for complete search history.

(56) References Cited

U.S. PATENT DOCUMENTS

| | | | |
|---|---|---|---|
| 9,953,930 B1* | 4/2018 | Chiu | H01L 21/56 |
| 10,438,901 B1 | 10/2019 | Krefft et al. | |
| 10,964,645 B2 | 3/2021 | Yazaki et al. | |
| 11,476,172 B2 | 10/2022 | Otsubo et al. | |
| 2007/0176281 A1* | 8/2007 | Kim | H01L 25/0655 257/700 |
| 2011/0274299 A1* | 11/2011 | Shaw | B81B 7/0064 381/174 |
| 2013/0088233 A1 | 4/2013 | Martius et al. | |
| 2013/0278268 A1 | 10/2013 | Martius et al. | |
| 2016/0227680 A1* | 8/2016 | Hyun | C23C 18/38 |
| 2019/0269046 A1* | 8/2019 | Takizawa | H01L 23/3121 |
| 2019/0311994 A1* | 10/2019 | Hong | H01L 21/56 |
| 2019/0363055 A1* | 11/2019 | Yazaki | H01L 23/3121 |
| 2020/0203287 A1 | 6/2020 | Krefft et al. | |
| 2022/0021246 A1* | 1/2022 | Li | H02J 50/005 |
| 2022/0336510 A1* | 10/2022 | Hai | H01L 27/14603 |

FOREIGN PATENT DOCUMENTS

| | | |
|---|---|---|
| CN | 203872502 U | 10/2014 |
| CN | 105304582 A | 2/2016 |
| CN | 106409774 A | 2/2017 |
| CN | 108990403 A | 12/2018 |
| CN | 210223996 U | 3/2020 |
| CN | 111277053 A | 6/2020 |
| CN | 111670496 A | 9/2020 |
| JP | 2004235244 A | 8/2004 |
| WO | 2019156051 A1 | 8/2019 |

* cited by examiner (a)

(b)

(c)

(d)

PACKAGE BODY, PREPARATION METHOD THEREOF, TERMINAL, AND ELECTRONIC DEVICE

CROSS-REFERENCE TO RELATED APPLICATIONS

This application is a U.S. National Stage of International Application No. PCT/CN2021/120376, filed on Sep. 24, 2021, which claims priority to Chinese Patent Application No. 202011023979.6, filed on Sep. 25, 2020, both of which are incorporated herein by reference in their entireties.

TECHNICAL FIELD

This application relates to a package body with low frequency electromagnetic shielding effectiveness, a preparation method of the package body, and a terminal and an electronic device to which the package body is applied.

BACKGROUND

With advent of the 5G era, internal spaces of consumer mobile terminal products (for example, mobile phones) tend to be tight. To improve an integration of a hardware system, currently, a package solution with a high integration is widely used in the industry, for example, a system in package (System in package, SiP). To be specific, some discrete active or passive devices are modularized, and a nanoscale metal shielding layer, that is, conformal shielding (conformal shielding), is formed on a surface of a package body, to replace a conventional shielding cover that occupies more areas, thereby improving the integration. The package with the conformal shielding requires shielding effectiveness equivalent to that of the conventional shielding cover. The nanoscale metal thin layer is formed on the top and the side surface of the package body through a process such as sputtering or spraying, to confine electromagnetic waves inside the package body, which greatly reduces electromagnetic energy radiated from the inside of the package body to the outside, so that sensitive devices easily suffering from electromagnetic interference near the module with the conformal shielding are protected from interference. However, a low frequency (generally under 10 MHz) electromagnetic wave has a large skin depth in metal, resulting in a low absorption loss of the nanoscale metal shielding thin layer on the electromagnetic wave and relatively low shielding effectiveness of the conformal shielding layer at a low frequency (larger shielding effectiveness of the conformal shielding indicates a higher degree of suppression on the electromagnetic energy, radiated from the inside of the package to the outside). Currently, a plurality of SiP modules in terminal devices such as mobile phones have strong low frequency interfering sources inside, but the existing shielding structure has a very limited shielding effect on the low frequency electromagnetic wave, making surrounding devices sensitive to low frequency susceptible to interference.

SUMMARY

A first aspect of embodiments of this application provides a package body including:
 a substrate;
 a plurality of electronic components, arranged on the substrate;
 a package material layer, located on the substrate and packaging the plurality of electronic components; and
 a low frequency shielding conductive structure, embedded in the package material layer, where the low frequency shielding conductive structure is located on a side of the package material layer away from the substrate and is spaced apart from the plurality of electronic components, the low frequency shielding conductive structure is provided with a plurality of through holes, an area of an opening of each of at least some through holes is less than 1 mm*1 mm, and a thickness of the low frequency shielding conductive structure is not less than 10 μm.

In this application, the low frequency shielding conductive structure with a plurality of micro through holes can better shield electromagnetic waves in a low-frequency frequency band, that is, does not allow the electromagnetic waves to penetrate a non-conductive region (the through holes). In addition, in order to ensure the shielding effectiveness of the package for a low frequency (less than 10 MHz), a thickness of the low frequency shielding conductive structure is set to not less than 10 μm, to increase a loss degree of the electromagnetic waves in the low frequency shielding conductive structure. Therefore, the entire package body has good shielding effectiveness on the low frequency electromagnetic waves.

In this implementation of this application, the low frequency shielding conductive structure is made of a conductive material with a conductivity not lower than 5×10$^6$ S/m or a magnetic permeability greater than or equal to 4π×10$^{-7}$ H/m.

The selection of the conductive material with a high conductivity and a high magnetic permeability can further increase the loss degree of the electromagnetic waves in the low frequency shielding conductive structure.

In this implementation of this application, the plurality of electronic components include electronic components emitting low frequency electromagnetic waves, and a range of the low frequency is less than 10 MHz; and the low frequency shielding conductive structure covers at least the electronic components emitting the low frequency electromagnetic waves, and a region covering the electronic components emitting the low frequency electromagnetic waves is meshed.

The low frequency shielding structure does not necessarily cover a top region of the entire package body, and a region where the low frequency shielding conductive structure is arranged covers at least the electronic components emitting the low frequency electromagnetic waves.

In this implementation of this application, the area of the opening of each through hole in the region covering the electronic components emitting the low frequency electromagnetic waves in the low frequency shielding conductive structure is less than 1 mm*1 mm.

By setting the size of the opening of the through hole, a low frequency electromagnetic wave having a relatively long wavelength cannot penetrate the non-conductive region (the through holes) of the low frequency shielding conductive structure.

In this implementation of this application, the plurality of through holes of the low frequency shielding conductive structure are arranged in an array.

The arrangement of the through holes is not limited to array arrangement, but may be irregular arrangement, and a shape of the through hole is not limited, as long as it is ensured that the region of the low frequency shielding conductive structure covering the electronic components emitting the low frequency electromagnetic waves is meshed.

In this implementation of this application, a conformal shielding layer is further arranged on an outer surface of the package material layer, and the conformal shielding layer is a nanoscale conductive thin layer; and the low frequency shielding conductive structure is connected to the conformal shielding layer.

The conformal shielding layer is generally a conductive metal layer with a thickness not greater than 10 micrometers; and the conformal shielding layer is mainly configured to shield high frequency (which is generally higher than 10 MHz) electromagnetic waves.

In this implementation of this application, a complete conductive thin layer is further arranged between the low frequency shielding conductive structure and the conformal shielding layer.

By adding a complete conductive thin layer, the low frequency electromagnetic shielding effectiveness of the package body can further be improved.

In this implementation of this application, a grounded conductive partition wall is further embedded in the package material layer, to divide the package body into at least two compartments, so as to weaken coupling of electromagnetic waves between different compartments.

The conductive partition wall penetrates the package material layer, and one end of the conductive partition wall is connected to the substrate, to divide the package body into at least two compartments, so as to greatly weaken coupling of electromagnetic waves between the compartments, thereby implementing shielding between the electronic components inside the package body.

In this implementation of this application, a complete conductive thin layer covers a surface of the low frequency shielding conductive structure away from the substrate.

By adding a complete conductive thin layer, the low frequency electromagnetic shielding effectiveness of the package body can further be improved.

A second aspect of the embodiments of this application provides a preparation method of a package body, including:
 providing an initial package body, where the initial package body includes a substrate, a plurality of electronic components arranged on the substrate, and a package material layer located on the substrate and packaging the plurality of electronic components;
 providing a groove on a side of the package material layer away from the substrate, where at least a part of the groove is meshed, a depth of the groove is not less than 10 μm, the groove is spaced apart from the plurality of electronic components, the meshed part of the groove divides the package material layer into a plurality of spaced units, and an area of each unit is less than 1 mm*1 mm; and
 forming a conductive material in the groove, to form a low frequency shielding conductive structure.

The preparation method of a package body is simple and easy to implement.

In this implementation of this application, the preparation method further includes forming a conformal shielding layer on an outer surface of the package material layer, where the conformal shielding layer is in contact with the low frequency shielding conductive structure.

The conformal shielding layer is generally a conductive metal layer with a thickness not greater than 10 micrometers; and the conformal shielding layer is mainly configured to shield high frequency (which is generally higher than 10 MHz) electromagnetic waves.

In this implementation of this application, the preparation method further includes forming a conductive thin layer on a surface of the low frequency shielding conductive structure away from the substrate.

By adding a complete conductive thin layer, the low frequency electromagnetic shielding effectiveness of the package body can further be improved.

In this implementation of this application, the conductive material formed in the groove has a conductivity of not less than $5\times10^6$ S/m or a magnetic permeability of greater than or equal to $4\pi\times10^{-7}$ H/m.

The selection of the conductive material with a high conductivity and a high magnetic permeability can further increase the loss degree of the electromagnetic waves in the low frequency shielding conductive structure.

In this implementation of this application, the plurality of electronic components include electronic components that emit low frequency electromagnetic waves, a range of the low frequency is less than 10 MHz, the low frequency shielding conductive structure covers at least the electronic components emitting the low frequency electromagnetic waves, and a region of the low frequency shielding conductive structure covering the electronic components emitting the low frequency electromagnetic waves is meshed; and an area of an opening of each through hole in the meshed part of the low frequency shielding conductive structure is less than 1 mm*1 mm.

The low frequency shielding structure does not necessarily cover a top region of the entire package body, and a region where the low frequency shielding conductive structure is arranged covers at least the electronic components emitting the low frequency electromagnetic waves.

A third aspect of the embodiments of this application provides a terminal, including a housing and a package body accommodated in the housing, where the package body is the foregoing package body.

A fourth aspect of the embodiments of this application provides an electronic device, including the foregoing package body.

The low frequency shielding conductive structure is arranged to effectively shield the low frequency electromagnetic waves, and the terminal and the electronic device in this application can effectively protect the low frequency sensitive device from interference of the low frequency electromagnetic waves, thereby achieving a good use effect.

LIST OF REFERENCE NUMERALS

Figure 1:
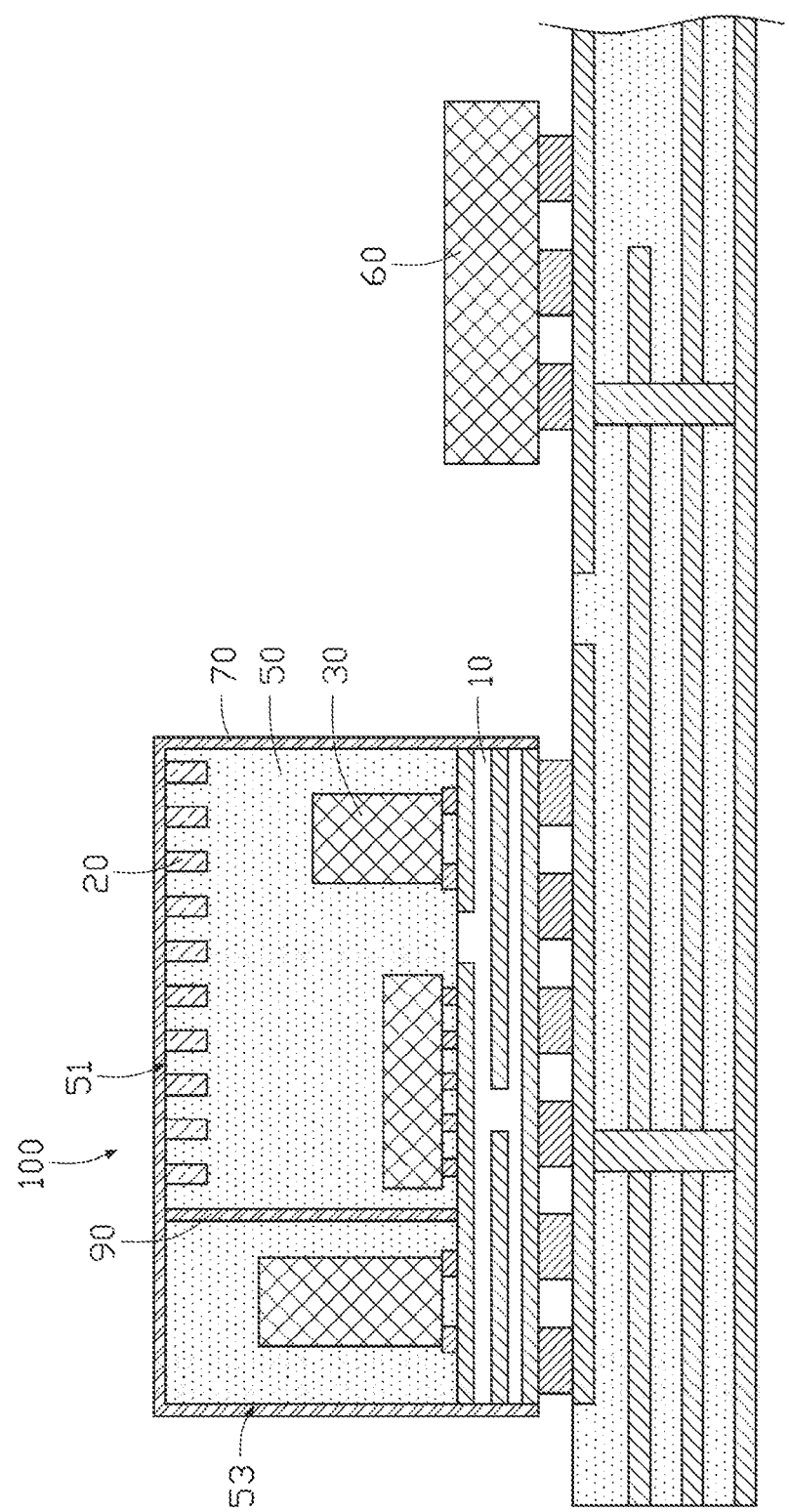
FIG. 1 is a schematic cross-sectional view in which a package body and a device sensitive to a low frequency electromagnetic wave are adjacent according to Embodiment 1 of this application.

Package body 100, 200, 300, and 400
Substrate 10
Electronic component; 30
Package material layer 50
Device sensitive to a low frequency 60
electromagnetic wave
Low frequency shielding conductive 20
structure
Through hole 21
Relatively large through hole 25
Conformal shielding layer 70
Top surface 51
Side surface 53
Groove 55
Slot 57
Conductive partition wall 90
Conductive thin layer 40

DESCRIPTION OF EMBODIMENTS

The following describes the embodiments of this application with reference to the accompanying drawings in the embodiments of this application.

Embodiment 1

A terminal (not shown in the figure) includes: a housing (not shown in the figure) and a package body 100 located in the housing. The terminal may be an electronic device such as a mobile phone or a tablet computer.

Referring to FIG. 1, the package body 100 includes a substrate 10, a plurality of electronic components 30 arranged on the substrate 10, and a package material layer 50 located on the substrate 10 and packaging the plurality of electronic components 30.

The plurality of electronic components 30 may include one or more passive components. The passive components include, but are not limited to, a resistor, a capacitor, an inductor, a filter, a coupler, and the like. The plurality of electronic components 30 may further include one or more active components such as active chips. The active components include, but are not limited to, a power chip, a digital chip, a radio frequency chip, and the like. The active components and the passive components in the plurality of electronic components 30 include electronic components 30 emitting low frequency electromagnetic waves. In this application, the "low frequency" refers to a frequency less than 10 MHz, for example, greater than or equal to 10 kHz and less than 10 MHz. The package material layer 50 has a low dielectric constant and completely covers the plurality of electronic components 30.

As shown in FIG. 1, a device 60 such as a near field communication (Near field communication, NFC) chip sensitive to a low frequency electromagnetic wave is disposed in the housing and beside the package body 100. However, an existing package body has a very limited shielding effect on a low frequency (which is generally under 10 MHz) electromagnetic wave, making surrounding devices 60 sensitive to the low frequency electromagnetic waves susceptible to interference. For example, in this embodiment, when the outside communicates with the NFC chip, low frequency noise in the low frequency electronic component 30 interferes with the NFC chip through an internal space of the package body 100 due to the proximity of the low frequency electronic component 30 and the NFC chip, resulting in reduction of the performance of NFC communication. Therefore, in this application, a low frequency shielding conductive structure 20 is arranged in the package body 100. The low frequency shielding conductive structure 20 can effectively shield the low frequency electromagnetic wave, thereby protecting the device 60 sensitive to the low frequency electromagnetic wave from interference of the low frequency electromagnetic wave.

Figure 2:
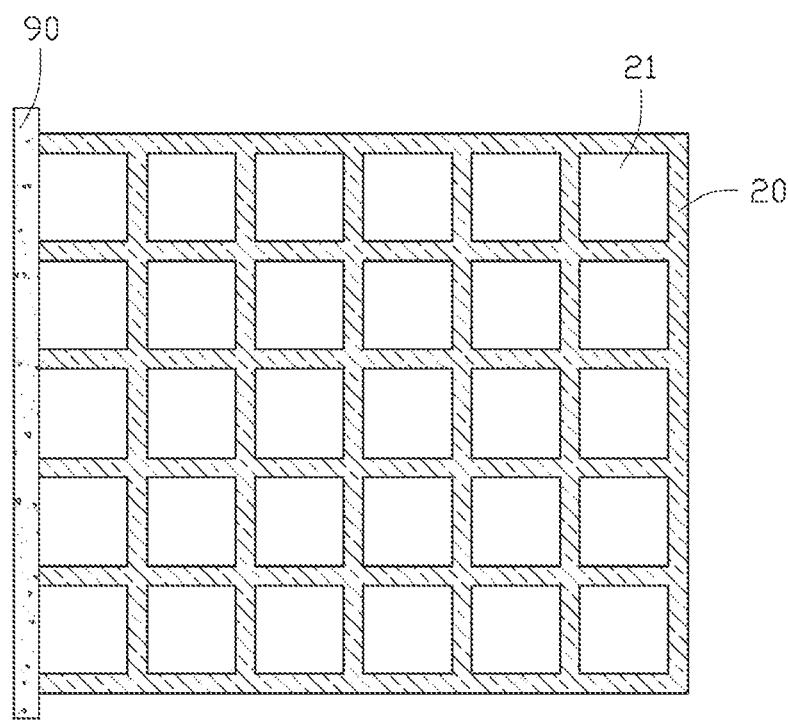
FIG. 2 is a schematic top view of a low frequency shielding conductive structure and a conductive partition wall in FIG. 1.

As shown in FIG. 1, the low frequency shielding conductive structure 20 is embedded in the package material layer 50, and the low frequency shielding conductive structure 20 is located on a side of the package material layer 50 away from the substrate 10 and is spaced apart from the plurality of electronic components 30. A surface of the low frequency shielding conductive structure 20 away from the substrate 10 is exposed relative to the package material layer 50. At least a part of the low frequency shielding conductive structure 20 is meshed, and the meshed part is provided with a plurality of through holes 21. Referring to FIG. 2, the entire low frequency shielding conductive structure 20 is meshed. The low frequency shielding conductive structure 20 is provided with a plurality of through holes 21. In this embodiment, the plurality of through holes 21 are arranged in a matrix, and an area of an opening of each through hole 21 is less than 1 mm*1 mm. A thickness of the low frequency shielding conductive structure 20 is not less than 10 μm, for example, is greater than 10 μm and less than or equal to 100 μm. Because the low frequency shielding conductive structure 20 is embedded in the package material layer 50, each through hole 21 is filled with a package material of the package material layer 50.

The low frequency shielding conductive structure 20 is made of a conductive material with a high conductivity (where the conductivity is not lower than $5 \times 10^6$ S/m) or a high magnetic permeability (where the magnetic permeability is greater than or equal to $4\pi \times 10^{-7}$ H/m), for example, copper metal.

The low frequency shielding principle of the low frequency shielding conductive structure 20 is described as follows: Wavelengths (30 m to 30000 m) of low frequency (10 kHz to 10 MHz) electromagnetic waves are relatively long, and the through holes 21 of the low frequency shielding conductive structure 20 are set relative small, so that the low frequency electromagnetic waves cannot penetrate a non-conductive region (a region of the through holes 21). In addition, in order to ensure the shielding effectiveness of the package for the low frequency (10 kHz to 10 MHz), it is necessary to increase a loss degree of the electromagnetic wave in the conductive structure.

$$\text{Loss degree} = \text{attenuation factor} \times \text{thickness of conductive structure} \quad (1)$$

$$\text{Attenuation factor} = 1/\text{skin depth} \quad (2)$$

$$\text{Skin depth} = (2/(\text{angular frequency} * \text{magnetic permeability} * \text{conductivity}))^{0.5} \quad (3)$$

Based on the formula (1), in addition to increasing the attenuation factor, the loss degree may be increased by increasing the thickness of the low frequency shielding conductive structure 20. Therefore, it is recommended that the thickness of the low frequency shielding conductive structure 20 be not less than 10 μm.

In addition, to increase the attenuation factor, that is, to decrease the skin depth, the conductive material with the high conductivity (where the conductivity is not lower than $5 \times 10^6$ S/m) or the high magnetic permeability (where the magnetic permeability is greater than or equal to $4\pi \times 10^{-7}$ H/m) needs to be selected as the material of the low frequency shielding conductive structure 20.

The low frequency shielding conductive structure 20 can greatly dissipate low frequency electromagnetic noise from the electronic component 30 below the low frequency shielding conductive structure, thereby significantly improving the shielding effectiveness of the package body 100 on electromagnetic radiation.

The low frequency shielding conductive structure 20 does not necessarily cover a top region of the entire package body 100, and a region where the low frequency shielding conductive structure is arranged is related to a position of a low frequency noise source. The low frequency shielding conductive structure 20 needs to be arranged in a projection region of the low frequency electronic component and in a nearby region, to ensure that the low frequency electromagnetic wave emitted by the low frequency electronic component 30, after being transmitted over the package material layer 50, can be intercepted by the low frequency shielding conductive structure 20. The arrangement position of the low frequency shielding conductive structure 20 covers at least the low frequency electronic components 30, and a region covering the low frequency electronic components 30 is meshed, and an area of an opening of each through hole 21 in the meshed region is less than 1 mm*1 mm.

Figure 3:
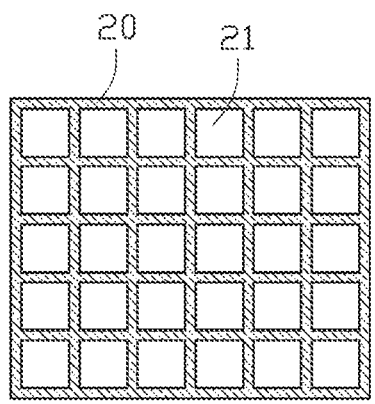
FIG. 3 is a schematic diagram of several shapes of a low frequency shielding conductive structure.
Figure 3:
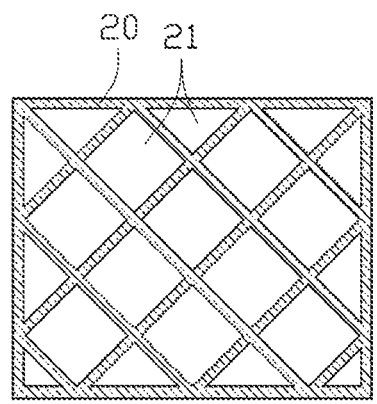
Figure 3:
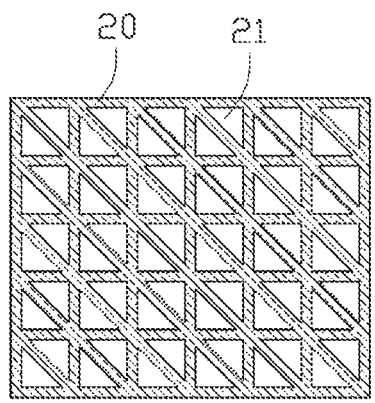
Figure 3:
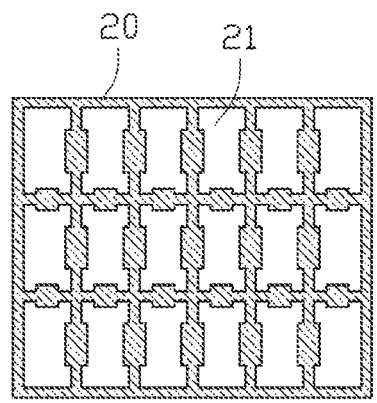

As shown in FIG. 2, each through hole 21 of the low frequency shielding conductive structure 20 is a square, and the plurality of through holes 21 are arranged in an array. The shape of the through hole 21 is not limited and may be another shape. FIG. 3 shows the low frequency shielding conductive structure 20 in several different shapes. The shape of the through hole 21 may alternatively be a rectangle, a triangle, or another irregular shape.

Figure 4A:
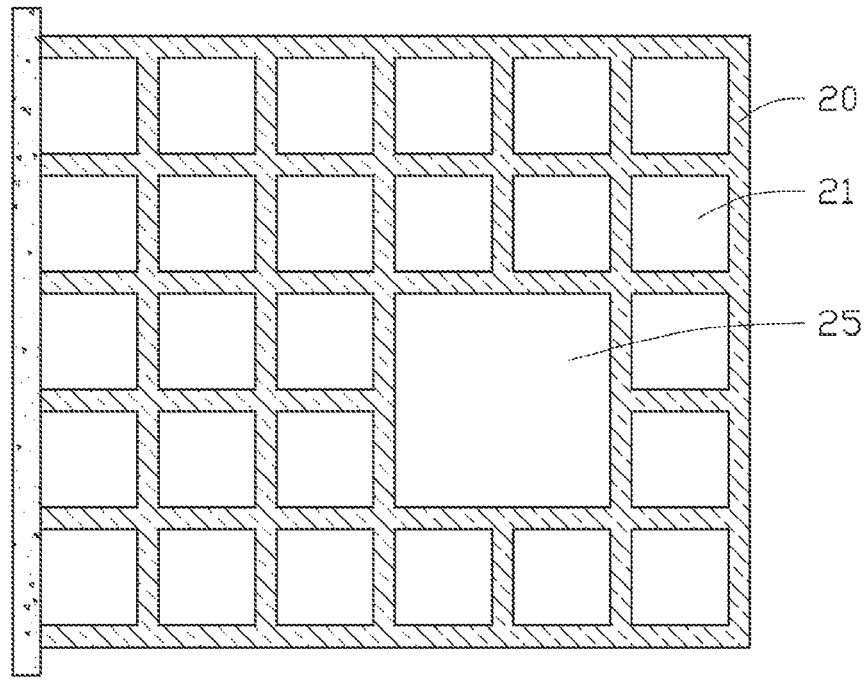
FIG. 4A and FIG. 4B are respectively a schematic top view and a schematic cross-sectional view of a package body according to an alternative embodiment.
Figure 4B:
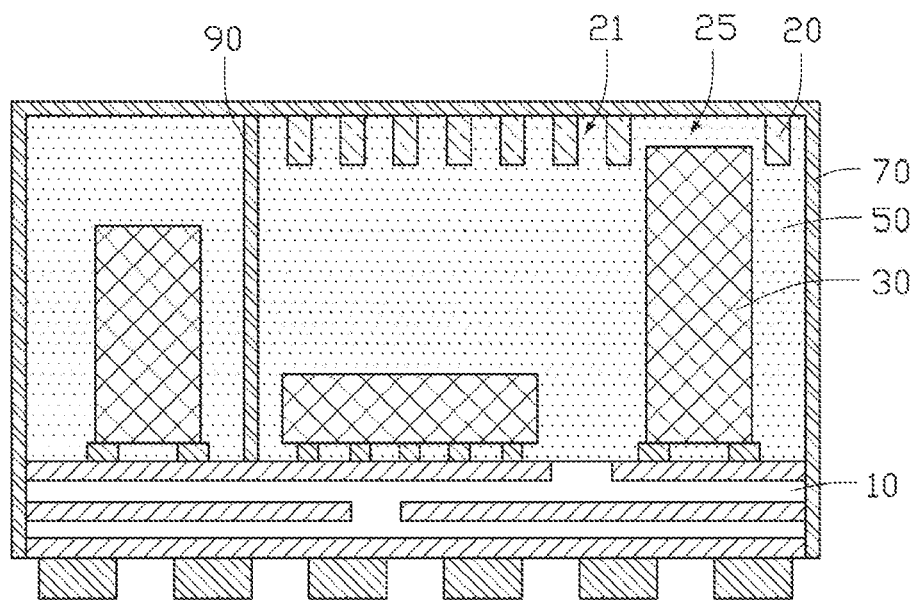

The plurality of through holes 21 may be arranged regularly and evenly, for example, array arrangement shown in FIG. 3. In another embodiment, as shown in FIG. 4A, the plurality of through holes 21 may alternatively be arranged unevenly. As shown in FIG. 4A, there is a relatively large through hole 25 (a blank region) in the plurality of through holes 21, and areas of the remaining through holes 21 are equal and are all less than 1 mm*1 mm. As shown in FIG. 4B, the relatively large through hole 25 directly faces one electronic component 30, the electronic component 30 has a height greater than heights of other electronic components 30 and is not the low frequency electronic component, and an area of the relatively large through hole 25 is greater than a cross section of the electronic component 30 for the electronic component 30 to run through the relatively large through hole 25. That is, the region directly facing the electronic component 30 is not provided with the meshed part of the low frequency shielding conductive structure 20, but is blank. In this way, even if the height of the electronic component 30 in a local region of the package body 100 is relatively high, an overall height of the package body 100 does not increase due to the introduction of the low frequency shielding conductive structure 20.

As shown in FIG. 1, a conformal shielding layer 70 is further arranged on an outer surface of the package material layer 50, and the low frequency shielding conductive structure 20 is in direct contact with and connected to the conformal shielding layer 70. The package material layer 50 includes a top surface 51 away from the substrate 10 and a plurality of side surfaces 53 connected to the top surface 51. The conformal shielding layer 70 completely covers the top surface 51 and the plurality of side surfaces 53 and extends along the side surfaces 53 to cover a surface where the substrate 10 is coplanar with the side surface 53. The conformal shielding layer 70 is a nanoscale conductive metal layer and is generally a conductive metal layer with a thickness not greater than 10 micrometers. The conformal shielding layer 70 is mainly configured to shield high frequency (which is generally greater than 10 MHz) electromagnetic waves.

As shown in FIG. 1, the low frequency shielding conductive structure 20 is flush with the top surface 51 of the package material layer 50, so that the low frequency shielding conductive structure 20 and the conformal shielding layer 70 can be better connected.

The surface of the low frequency shielding conductive structure 20 away from the substrate 10 is in contact with the conformal shielding layer 70. The low frequency shielding conductive structure 20 may further extend to an edge of the package body 100 and is in contact with a part of the conformal shielding layer 70 covering the side surfaces 53, or may not extend to an edge of the package body 100 and is not in contact with a part of the conformal shielding layer 70 covering the side surfaces 53.

In addition, a compartment shielding (compartment shielding) technology is used to ensure that the electronic components 30 inside the package body 100 do not interfere with each other. As shown in FIG. 1, a grounded conductive partition wall 90 may further be embedded in the package material layer 50, to divide the package body 100 into at least two compartments, so that coupling of electromagnetic waves between the compartments is greatly weakened, thereby implementing shielding between the internal electronic components 30 of the package body 100. One end of the conductive partition wall 90 is connected to the conformal shielding layer 70, and an other end of the conductive partition wall is connected to the substrate 10.

A simulation test of shielding effectiveness is performed for two groups of Experimental Examples 1-2 and two groups of Comparative Examples 1-2 of this application below, and test results are shown in Table 1 below. In Comparative Example 1, the conformal shielding layer 70 has a thickness of 3 μm, in Experimental Example 1, in addition to the conformal shielding layer 70 with the thickness of 3 μm, the low frequency shielding conductive structure 20 is arranged (a thickness is 50 μm, and the through hole 21 is a square with a side length of 0.5 mm), and another condition of Comparative Example 1 is the same as that of Experimental Example 1. In Comparative Example 2, the conformal shielding layer 70 has a thickness of 9 μm, in Experimental Example 2, in addition to the conformal shielding layer 70 with the thickness of 9 μm, the low frequency shielding conductive structure 20 is arranged (a thickness is 50 μm, and the through hole 21 is a square with a side length of 0.5 mm), and another condition of Comparative Example 2 is the same as that of Experimental Example 2.

TABLE 1

| Frequencies of electromagnetic waves | Comparative Example 1 | Experimental Example 1 | Comparative Example 2 | Experimental Example 2 |
|---|---|---|---|---|
| | | Shielding effectiveness | | |
| 100 KHz | 0.7 dB | 4.6 dB | 2 dB | 5.2 dB |
| 1 MHz | 2 dB | 15.5 dB | 5.5 dB | 18 dB |
| 10 MHz | 13 dB | 30 dB | 24 dB | 34 dB |

It can be learned from Table 1 that at a frequency of 1 MHz, the shielding effectiveness of the conformal shielding layer with the thickness of 3 μm is only 2 dB, while the shielding effectiveness of the conformal shielding layer with the thickness of 9 μm is only 5.5 dB. The shielding effectiveness can be increased by 12.5 dB and 13.5 dB respectively after the low frequency shielding conductive structure is added. At a frequency of 10 MHz, the shielding effectiveness of the conformal shielding layer with the thickness of 3 μm is only 13 dB, while the shielding effectiveness of the conformal shielding layer with the thickness of 9 μm is only 24 dB. The shielding effectiveness can be increased by 17 dB and 10 dB respectively after the low frequency shielding conductive structure is added.

In this embodiment, the low frequency shielding conductive structure 20 that is provided with the plurality of through holes 21 is arranged on the top of the package body 100 and is connected to the conformal shielding layer 70, to greatly improve the shielding effectiveness on low frequency electromagnetic radiation. In addition, the low frequency shielding conductive structure 20 can further assist in increasing the shielding effectiveness on high frequency electromagnetic radiation to some extent.

Embodiment 2

Figure 5:
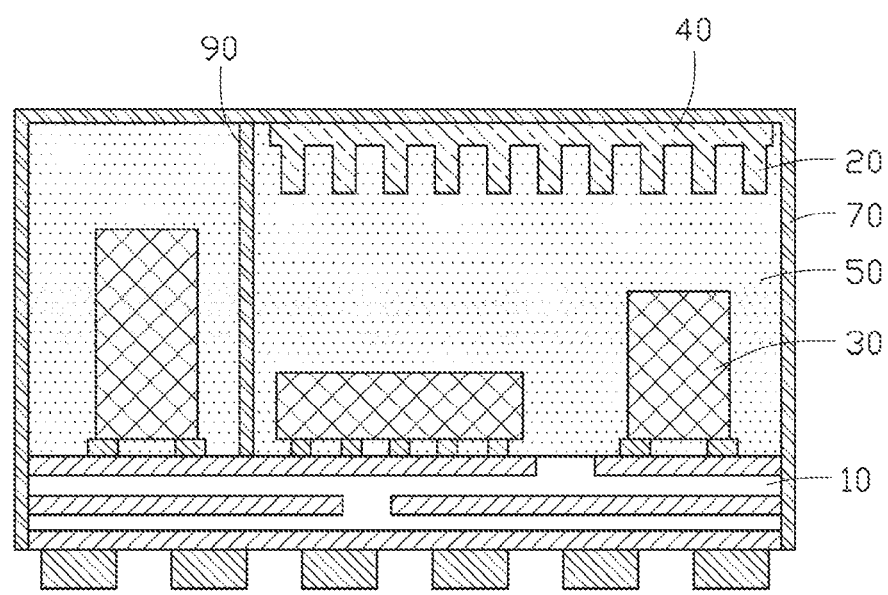
FIG. 5 is a schematic cross-sectional view of a package body according to Embodiment 2 of this application.

Referring to FIG. 5, a package body 200 of Embodiment 2 of this application is substantially consistent with the structure of the package body 100 of Embodiment 1, and a difference lies in that in the package body 200 of this embodiment, a complete conductive thin layer 40 is further arranged between the low frequency shielding conductive structure 20 and the conformal shielding layer 70.

The conductive thin layer 40 is embedded in the package material layer 50. The conductive thin layer 40 may have any thickness. The conformal shielding layer 70 is on the conductive thin layer 40. In this way, the shielding effectiveness can further be improved, and a preparation method of the package body 200 may be simpler than that of Embodiment 1, for example, mechanical grinding on the low frequency shielding conductive structure 20 with the through holes 21 and the package material layer 50 is not required.

Compared with Embodiment 1, in the package body 200 of this embodiment, the complete conductive thin layer 40 is added, and the presence of the conductive thin layer 40 can further dissipate upward propagated electromagnetic waves, thereby further improving the low frequency electromagnetic shielding effectiveness of the package body 100.

Embodiment 3

Figure 6:
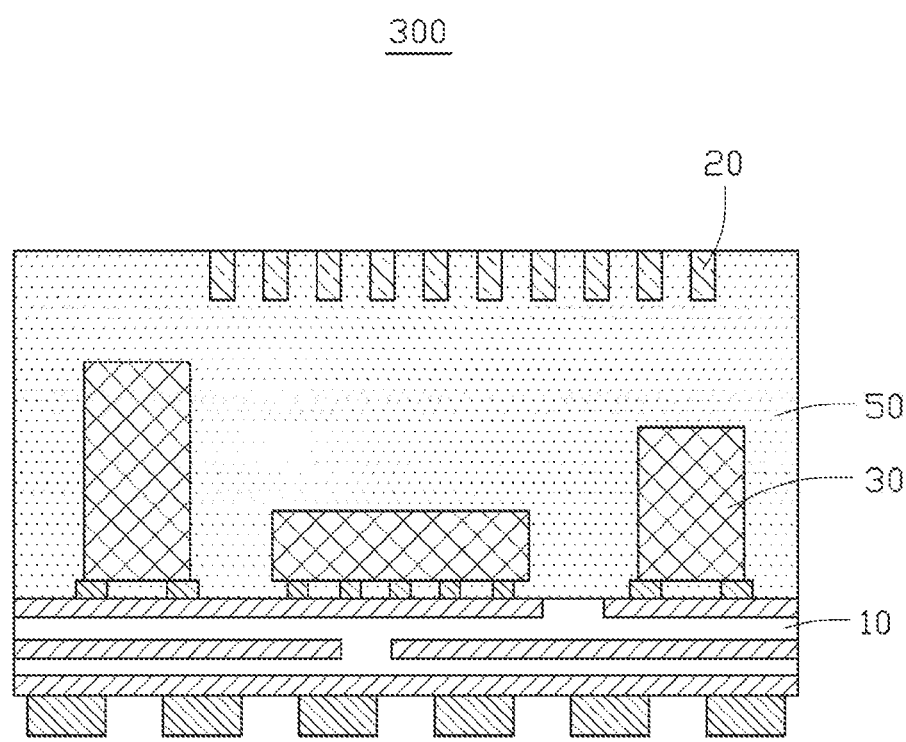
FIG. 6 is a schematic cross-sectional view of a package body according to Embodiment 3 of this application.

Referring to FIG. 6, a package body 300 of Embodiment 3 of this application is substantially consistent with the structure of the package body 100 of Embodiment 1, and a difference lies in that in the package body 300 of this embodiment, the conformal shielding layer 70 and the conductive partition wall 90 are not arranged.

In this way, the costs of process and material caused by arranging the conformal shielding layer can be saved, and the low frequency shielding performance of the package body 100 can also be ensured. However, the high frequency shielding performance of the package body 300 is worse than that of the package body 100 provided with the conformal shielding layer 70, but for the package body 300 with only the low frequency electronic components 30 inside, only the low frequency shielding conductive structure 20 is arranged without considering the high frequency shielding performance.

Embodiment 4

Figure 7:
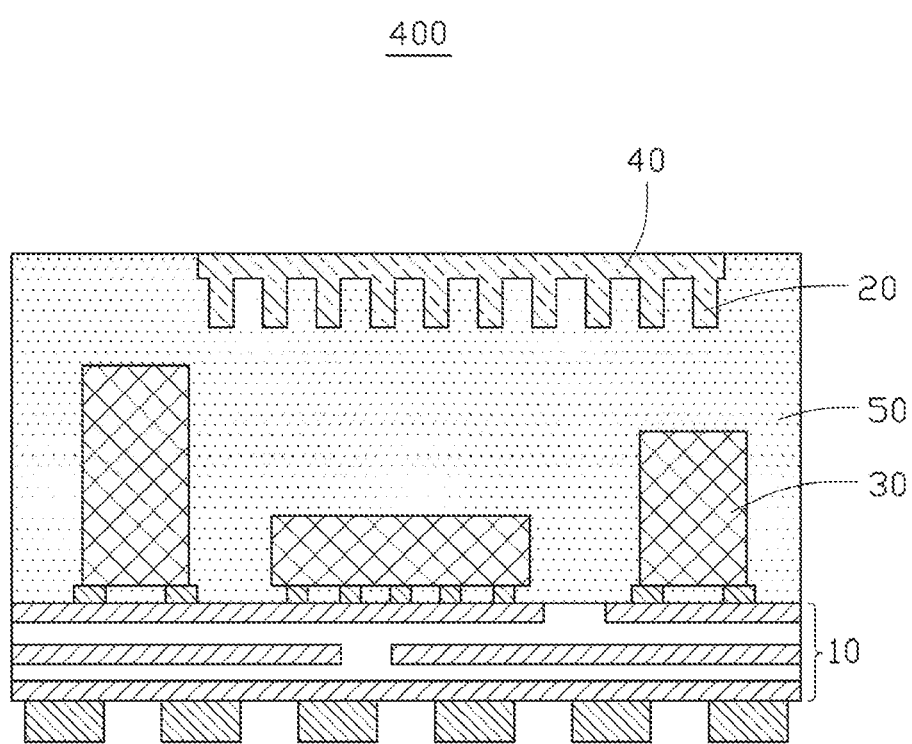
FIG. 7 is a schematic cross-sectional view of a package body according to Embodiment 4 of this application.

Referring to FIG. 7, a package body 400 of Embodiment 4 of this application is substantially consistent with the structure of the package body 200 of Embodiment 2, and a difference lies in that in the package body 400 of this embodiment, the conformal shielding layer 70 and the conductive partition wall 90 are not arranged.

The package body 400 of Embodiment 4 satisfies shielding requirements of the package requiring only low frequency shielding, and reduces the complexity and difficulty of process implementation.

This application further provides an electronic device (not shown in the figure), including at least one package body in Embodiment 1 to Embodiment 4

Referring to FIG. 8, this application further provides a preparation method of the package body, including the following steps.

Figure 8A:
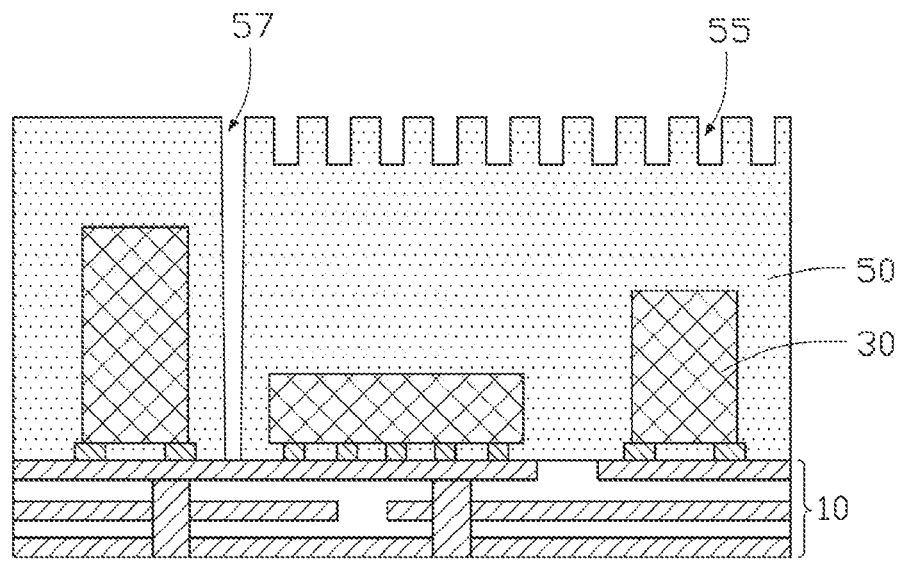
FIG. 8A to FIG. 8D are schematic cross-sectional views of preparing a package body according to Embodiment 1.

S1: As shown in FIG. 8A, provide an initial package body, where the initial package body includes a substrate 10, a plurality of electronic components 30 arranged on the substrate 10, and a package material layer 50 located on the substrate and packaging the plurality of electronic components 30.

The plurality of electronic components 30 may include one or more passive components and may further include one or more active components. The active components and the passive components in the plurality of electronic components 30 include low frequency electronic components 30. In this application, a range of the low frequency is less than 10 MHz, for example, is greater than or equal to 10 kHz and less than 10 MHz. The package material layer 50 has a low dielectric constant and the package material layer 50 completely covers the plurality of electronic components 30.

S2: As shown in FIG. 8A, provide a groove 55 on a side of the package material layer 50 away from the substrate 10, where at least a part of the groove 55 is meshed.

The groove 55 may be formed by laser grooving, but is not limited to laser grooving. A thickness of the groove 55 is not less than 10 μm, for example, is greater than 10 μm and less than or equal to 100 μm. The groove 55 does not run through the package material layer 50 and is spaced apart from the plurality of electronic components 30. The package material layer 50 is provided with a region of the meshed part of the groove 55, the region is divided by the groove 55 into a plurality of spaced units (not shown in the figure), and an area of each unit is less than 1 mm*1 mm. It may be understood that a slot 57 running through the package material layer 50 may further be formed together with the groove 55, and the slot 57 is configured to accommodate the conductive partition wall 90 subsequently.

Figure 8B:
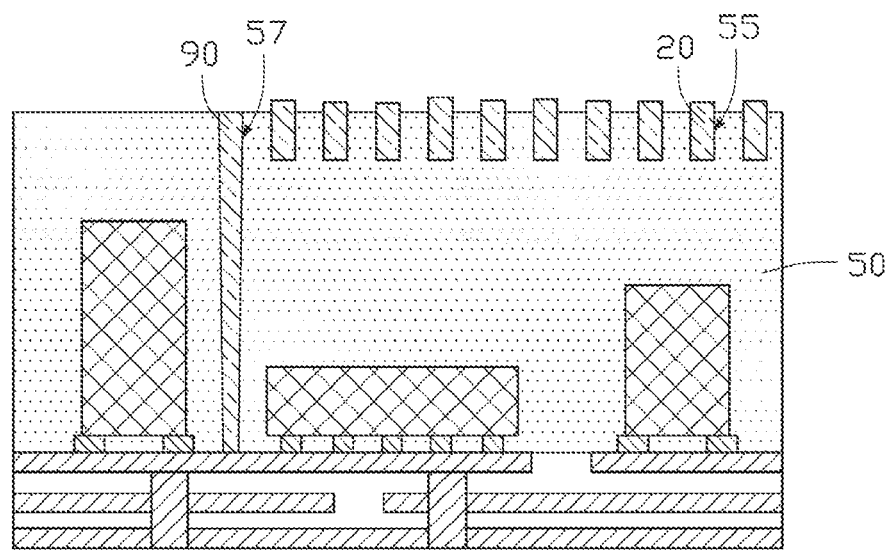

S3: As shown in FIG. 8B, form a conductive material in the groove 55, to form a low frequency shielding conductive structure 20.

The low frequency shielding conductive structure 20 may be formed by pouring conductive paste into the groove 55 and then thermal curing. It may be understood that the conductive paste may also be poured into the slot 57 and cured to form the conductive partition wall 90.

Figure 8C:
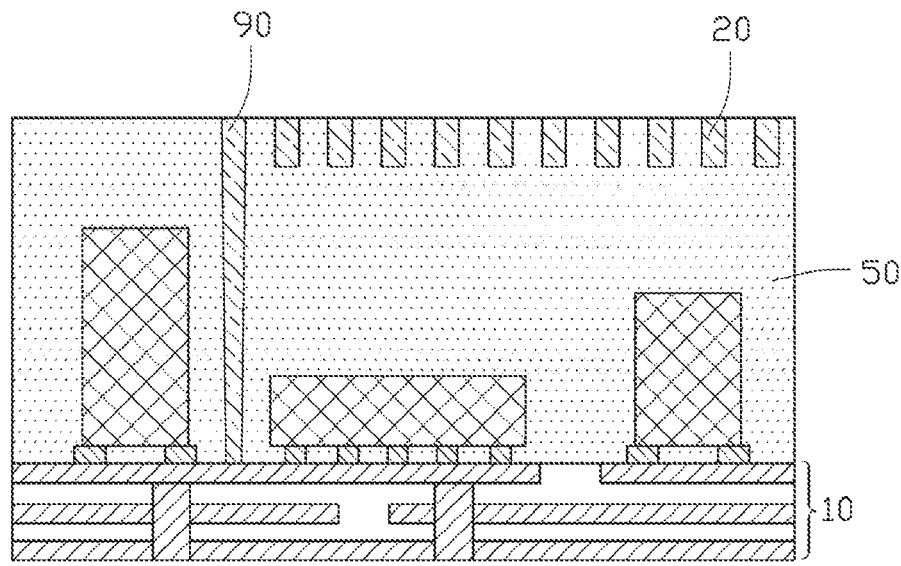

After curing, as shown in FIG. 8C, the low frequency shielding conductive structure 20 and the package material layer 50 may also be ground, so that the low frequency shielding conductive structure and the package material layer are away from a surface of the substrate 10 and are flush with the surface of the substrate.

Figure 8D:
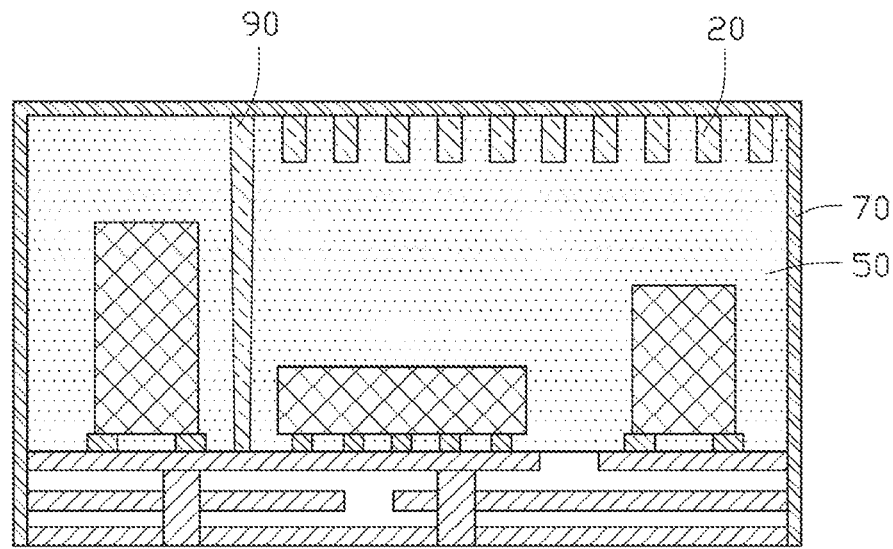

S4: As shown in FIG. 8D, form a conformal shielding layer 70 on an outer surface of the package material layer 50, where the conformal shielding layer 70 is in contact with the low frequency shielding conductive structure 20.

The conformal shielding layer 70 is also in contact with the conductive partition wall 90. The conformal shielding layer 70 may be formed by a process such as sputtering or spraying to form a nanoscale conductive metal layer and is generally a conductive metal layer with a thickness of not greater than 10 micrometers. Step S4 may also be omitted as required.

It may be understood that the method may further include: forming a conductive thin layer on a surface of the low frequency shielding conductive structure 20 away from the substrate 10 before forming the conformal shielding layer 70. For example, an accommodating groove (not shown in the figure) for accommodating the conductive thin layer may be provided when the groove 55 is provided on the package material layer 50, and then conductive materials are formed together in the groove 55 and the accommodating groove to form the low frequency shielding conductive structure 20 and the conductive thin layer.

It should be noted that, the foregoing is merely a specific implementation of this application, but are not intended to limit the protection scope of this application. Any variation or replacement readily figured out by a person skilled in the art within the technical scope disclosed in this application shall fall within the protection scope of this application. The implementations in this application and features in the implementations may be combined with each other in the case of no conflict. Therefore, the protection scope of this application shall be subject to the protection scope of the claims.

What is claimed is:

1. A package body, comprising:
    a substrate;
    a plurality of electronic components, arranged on the substrate, wherein the plurality of electronic components comprises electronic components configured to emit low frequency electromagnetic waves, and a frequency of the low frequency electromagnetic waves is less than 10 MHz;
    a package material layer, located on the substrate and packaging the plurality of electronic components; and
    a low frequency shielding conductive structure, embedded in the package material layer,
    wherein the low frequency shielding conductive structure is located on a side of the package material layer away from the substrate and is spaced apart from the plurality of electronic components,
    wherein the low frequency shielding conductive structure covers at least the electronic components that are configured to emit the low frequency electromagnetic waves, and a region of the low frequency shielding conductive structure covering the electronic components that are configured to emit the low frequency electromagnetic waves is meshed,
    wherein the low frequency shielding conductive structure is provided with a plurality of through holes,
    wherein an area of an opening of each of at least some of the through holes is less than 1 mm*1 mm, and
    wherein a thickness of the low frequency shielding conductive structure is not less than 10 µm.

2. The package body of claim 1, wherein the low frequency shielding conductive structure is made of a conductive material with a conductivity not lower than $5\times10^6$ S/m or a magnetic permeability greater than or equal to $4\pi\times10^{-7}$ H/m.

3. The package body of claim 1, wherein the area of the opening of each through hole in the region covering the electronic components that are configured to emit the low frequency electromagnetic waves in the low frequency shielding conductive structure is less than 1 mm*1 mm.

4. The package body of claim 1, wherein the plurality of through holes of the low frequency shielding conductive structure are arranged in an array.

5. The package body of claim 1, further comprising a conformal shielding layer arranged on an outer surface of the package material layer, wherein the conformal shielding layer is a nanoscale conductive metal layer, and wherein the low frequency shielding conductive structure is connected to the conformal shielding layer.

6. The package body of claim 5, further comprising a complete conductive thin layer arranged between the low frequency shielding conductive structure and the conformal shielding layer.

7. The package body of claim 1, further comprising a grounded conductive partition wall embedded in the package material layer, wherein the grounded conductive partition wall divides the package body into at least two compartments and is configured to weaken coupling of electromagnetic waves between different compartments.

8. The package body of claim 1, further comprising a complete conductive thin layer that covers a surface of the low frequency shielding conductive structure away from the substrate.

9. A terminal, comprising:
    a housing; and
    a package body accommodated in the housing, wherein the package body comprises:
        a substrate;
        a plurality of electronic components, arranged on the substrate, wherein the plurality of electronic components comprises electronic components configured to emit low frequency electromagnetic waves, and a frequency of the low frequency electromagnetic waves is less than 10 MHz;
        a package material layer, located on the substrate and packaging the plurality of electronic components; and
        a low frequency shielding conductive structure, embedded in the package material layer,
        wherein the low frequency shielding conductive structure is located on a side of the package material layer away from the substrate and is spaced apart from the plurality of electronic components,
        wherein the low frequency shielding conductive structure covers at least the electronic components that are configured to emit the low frequency electromagnetic waves, and a region of the low frequency shielding conductive structure covering the electronic components that are configured to emit the low frequency electromagnetic waves is meshed,
        wherein the low frequency shielding conductive structure is provided with a plurality of through holes,
        wherein an area of an opening of each of at least some of the through holes is less than 1 mm*1 mm, and
        wherein a thickness of the low frequency shielding conductive structure is not less than 10 µm.

10. The terminal of claim 9, wherein the low frequency shielding conductive structure is made of a conductive material with a conductivity not lower than $5\times10^6$ S/m or a magnetic permeability greater than or equal to $4\pi\times10^{-7}$/H/m.

11. The terminal of claim 9, wherein the area of the opening of each through hole in the region covering the electronic components that are configured to emit the low frequency electromagnetic waves in the low frequency shielding conductive structure is less than 1 mm*1 mm.

12. The terminal of claim 9, wherein the plurality of through holes of the low frequency shielding conductive structure are arranged in an array.

13. The terminal of claim 9, wherein the package body further comprises a conformal shielding layer arranged on an outer surface of the package material layer, wherein the conformal shielding layer is a nanoscale conductive metal layer, and wherein the low frequency shielding conductive structure is connected to the conformal shielding layer.

14. The terminal of claim 13, wherein the package body further comprises a complete conductive thin layer arranged between the low frequency shielding conductive structure and the conformal shielding layer.

15. The terminal of claim 9, wherein the package body further comprises a grounded conductive partition wall embedded in the package material layer, wherein the grounded conductive partition wall divides the package body into at least two compartments and is configured to weaken coupling of electromagnetic waves between different compartments.

* * * * *

UNITED STATES PATENT AND TRADEMARK OFFICE
CERTIFICATE OF CORRECTION

PATENT NO. : 12,317,464 B2
APPLICATION NO. : 18/041762
DATED : May 27, 2025
INVENTOR(S) : Le Zhang, Xueping Guo and Huijuan Wang It is certified that error appears in the above-identified patent and that said Letters Patent is hereby corrected as shown below:

In the Claims

Claim 10, Column 13, Line 2: "$10^{-7}/H/$" should read "$10^{-7}H/$"

Signed and Sealed this
Fifteenth Day of July, 2025

Coke Morgan Stewart
*Acting Director of the United States Patent and Trademark Office*